(12) United States Patent
Hatanaka

(10) Patent No.: US 8,133,578 B2
(45) Date of Patent: Mar. 13, 2012

(54) MICROSTRUCTURE AND METHOD OF MANUFACTURING THE SAME

(75) Inventor: Yusuke Hatanaka, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 589 days.

(21) Appl. No.: 12/344,032

(22) Filed: Dec. 24, 2008

(65) Prior Publication Data

US 2009/0166079 A1 Jul. 2, 2009

(30) Foreign Application Priority Data

Dec. 27, 2007 (JP) .................. 2007-337192
Apr. 25, 2008 (JP) .................. 2008-115077
Jul. 23, 2008 (JP) .................. 2008-189799

(51) Int. Cl.
*B32B 3/26* (2006.01)
*B05D 5/12* (2006.01)

(52) U.S. Cl. ............... 428/307.7; 428/306.6; 428/312.8; 428/314.2; 428/315.5; 428/318.4; 428/702; 427/99.5; 427/126.1; 427/239; 205/83

(58) Field of Classification Search .................. None
See application file for complete search history.

(56) References Cited

U.S. PATENT DOCUMENTS

| | | | |
|---|---|---|---|
| 5,262,226 A | 11/1993 | Yoshida | |
| 5,379,515 A | 1/1995 | Kondo | |
| 2005/0077542 A1 | 4/2005 | Asai | |
| 2006/0251871 A1* | 11/2006 | Masuda et al. | 428/209 |
| 2007/0284257 A1* | 12/2007 | Fukunaka et al. | 205/239 |

FOREIGN PATENT DOCUMENTS

| | | |
|---|---|---|
| EP | 1 612 891 A1 | 1/2006 |
| EP | 1 976 007 A2 | 10/2008 |
| GB | 1 203 089 | 8/1970 |
| JP | 3-182081 A | 8/1991 |
| JP | 2000-12619 A | 1/2000 |
| JP | 2002-134570 A | 5/2002 |
| JP | 2004-143524 * | 5/2004 |
| JP | 2005-85634 A | 3/2005 |

OTHER PUBLICATIONS

Translation of JP-2004-143524.*
EP Communication, dated Mar. 17, 2009, issued in corresponding EP Application No. 08021807.6, 3 pages.

* cited by examiner

*Primary Examiner* — Ling Xu
(74) *Attorney, Agent, or Firm* — Sughrue Mion, PLLC

(57) ABSTRACT

A microstructure that comprises an insulating base material having through micropores filled with metal at a high filling ratio and that can be used as an anisotropically conductive member is provided. The microstructure comprises an insulating base material having through micropores with a pore size of from 10 to 500 nm at a density of from $1\times10^6$ to $1\times10^{10}$ pores/mm$^2$, a metal being filled into the through micropores at a filling ratio of at least 80%.

16 Claims, 3 Drawing Sheets

102 101

108 107 109

106 104 105

MICROSTRUCTURE AND METHOD OF MANUFACTURING THE SAME

Figure 1A:
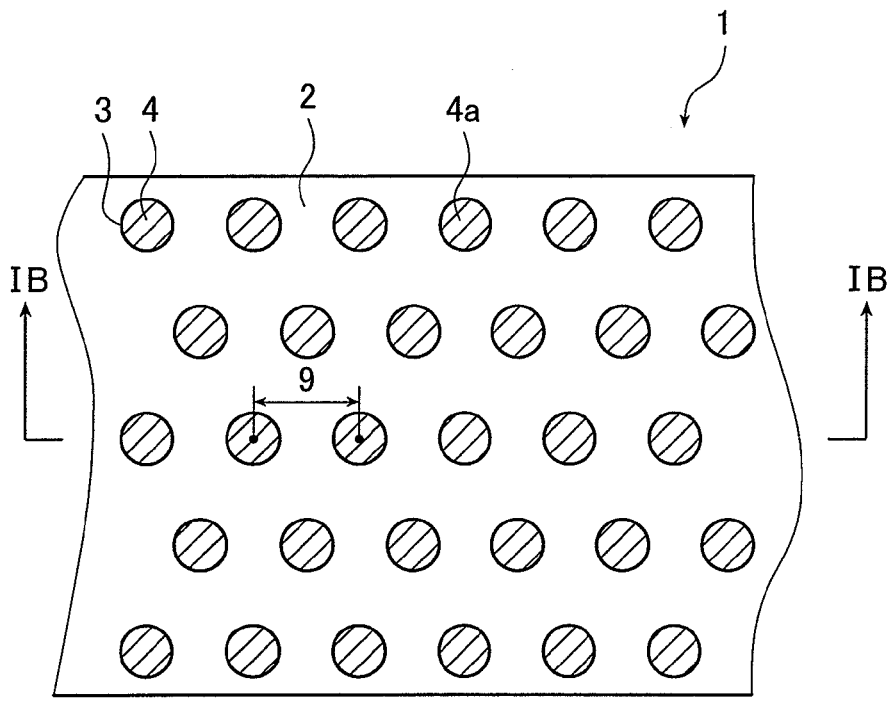

The entire contents of all documents cited in this specification are incorporated herein by reference.

BACKGROUND OF THE INVENTION

The present invention relates to a microstructure and its manufacturing method. More specifically, the invention relates to a microstructure comprising an insulating base material having through micropores filled with metal at a high filling ratio and its manufacturing method.

An anisotropically conductive member, when inserted between an electronic component such as a semiconductor device and a circuit board, then subjected to merely the application of pressure, is able to provide an electrical connection between the electronic component and the circuit board. Accordingly, such members are highly attractive members that are widely used, for example, as connecting members for semiconductor devices and other electronic components and as inspection connectors when carrying out functional inspections, and that can be expected to be applied to optical transmission materials.

In particular, owing to the remarkable degree of miniaturization that has occurred in electrically connecting members for semiconductor devices and the like, connection stability cannot be fully guaranteed in conventional techniques such as wire bonding that involve the direct connection of a wiring substrate. This situation has drawn attention in recent years to anisotropically conductive members of a type in which an array of electrically conductive elements pass completely through a film of insulating material, or of a type in which metal balls are arranged in a film of insulating material.

Inspection connectors are used to avoid the large monetary losses that are incurred when, upon carrying out functional inspections after an electronic component such as a semiconductor device has been mounted on a circuit board, the electronic component is found to be defective and the circuit board is discarded together with the electronic component.

That is, by bringing electronic components such as semiconductor devices into electrical contact with a circuit board through an anisotropically conductive member at positions similar to those to be used during mounting and carrying out functional inspections, it is possible to perform the functional inspections without actually mounting the electronic components on the circuit board itself, thus enabling the above problem to be avoided.

Such an anisotropically conductive member is described in JP 2000-012619 A, which discloses "an anisotropically conductive film comprising a film substrate composed of an adhesive insulating material and a plurality of conductive paths composed of an electrically conductive material which are arrayed within the film substrate in a mutually insulated state and pass entirely through the film substrate in a thickness direction thereof, wherein the conductive paths have shapes, in a cross-section parallel to a lengthwise direction of the film substrate, with circumferences having thereon an average maximum length between two points of from 10 to 30 µm, and wherein neighboring conductive paths have intervals therebetween which are from 0.5 to 3 times said average maximum length."

JP 2005-085634 A discloses "an anisotropically conductive film comprising a film base composed of an insulating resin and a plurality of conductive paths which are mutually insulated, pass entirely through the film base in a thickness direction thereof and are positioned in staggered rows, wherein conductive paths in mutually neighboring conductive path rows have a smaller distance therebetween than conductive paths within a single row of conductive paths."

JP 2000-012619 A and JP 2005-085634 A disclose methods of manufacturing such anisotropically conductive films in which fine wires of an anisotropically conductive material are inserted into an insulating film, the elements are integrally united by the application of heat and pressure, and scribing is subsequently carried out in the thickness direction.

JP 2002-134570 A examines a method of manufacturing an anisotropically conductive film which involves electroforming conductive columns using a resist and a mask, then pouring an insulating material in the columns and solidifying the insulating material.

JP 03-182081 A discloses "a method of manufacturing an electrically connecting member having a retaining body made of an electrically insulating material and a plurality of conductive elements provided in a mutually insulating state within the retaining body, wherein an end of each conductive element is exposed on a side of the retaining body and the other end of each conductive element is exposed on the other side of the retaining body, which method comprises:

a first step of exposing a matrix having a base and an insulating layer which, when deposited on the base, forms the retaining body to a high energy beam from the insulating layer side, thereby removing all of the insulating layer and part of the base in a plurality of regions so as to form a plurality of holes in the matrix;

a second step of filling the plurality of formed holes with a conductive material for forming said conductive elements so as to be flush with the sides of the insulating layer or to protrude from said sides; and a third step of removing said base."

JP 03-182081 A also carries out investigations on various materials (e.g., polyimide resins, epoxy resins and silicone resins) as the insulating layer.

However, with the increasing trend in recent years toward higher integration, electrode (terminal) sizes in electronic components such as semiconductor devices are becoming smaller, the number of electrodes (terminals) is increasing, and the distance between terminals is becoming tighter. Moreover, there have also appeared electronic components having a surface construction wherein the surface on each of the numerous terminals arranged at a tight pitch lies at a position that is more recessed than the surface of the component itself.

In order to be able to adapt to such electronic components, there has arisen a need to make the outer diameter (thickness) of the conductive paths in anisotropically conductive members smaller and to arrange the conductive paths in a tighter pitch.

However, in the methods of manufacturing the anisotropically conductive films and electrically connecting members described in the above references, it has been very difficult to reduce the size of the conductive paths. It is further difficult to fill the anisotropically conductive members at a high filling ratio in order to obtain small-sized conductive paths arranged at a tighter pitch.

Therefore, a method of filling such conductive members at a high filling ratio is expected in order to obtain small conductive paths arranged at a tighter pitch.

SUMMARY OF THE INVENTION

It is therefore an object of the invention to provide a microstructure that comprises an insulating base material having through micropores filled with metal at a high filling ratio and that can be used as an anisotropically conductive member which is adapted for an arrangement at a tighter pitch and which contains conductive paths having a dramatically increased density and, even today when still higher levels of integration have been achieved, can be used as inspection connectors and the like for electronic components such as semiconductor devices.

Another object of the invention is to provide a method of manufacturing such a microstructure.

The inventor has made an intensive study to achieve the above objects and discovered that by forming an electrode film having no voids on one surface of an insulating base material having through micropores and using the thus formed electrode film to carry out electrolytic plating, the through micropores can be filled with metal at a high filling ratio, and the invention has been completed.

Accordingly, the invention provides the following (i) to (v).
(i) A microstructure comprising an insulating base material having through micropores with a pore size of from 10 to 500 nm at a density of from $1\times10^6$ to $1\times10^{10}$ pores/mm$^2$, a metal being filled into the through micropores at a filling ratio of at least 80%.
(ii) The microstructure according to (i) above, wherein the insulating base material is an alumina base material obtained by anodizing aluminum.
(iii) The microstructure according to (i) or (ii) above, wherein a degree of ordering as defined by formula (I):

$$\text{Degree of ordering (\%)}=B/A\times100 \quad (1)$$

(wherein A represents a total number of through micropores in a measurement region, and B represents a number of specific through micropores in the measurement region for which, when a circle is drawn so as to be centered on a center of gravity of a specific through micropore and so as to be of a smallest radius that is internally tangent to an edge of another through micropore, the circle includes centers of gravity of six through micropores other than the specific through micropore) is at least 50%.
(iv) The microstructure according to any one of (i) to (iii) above, wherein the metal filled into the through micropores is exposed at a surface of the base material.
(v) The microstructure according to any one of (i) to (iii) above, wherein the metal filled into the through micropores protrudes from a surface of the base material.
(vi) A method of manufacturing a microstructure according to any one of (i) to (v) above, wherein an insulating base material is subjected at least to, in order,
(1) a treatment for forming an electrode film having no voids on one surface of the insulating base material having through micropores with a pore size of from 10 to 500 nm at a density of from $1\times10^6$ to $1\times10^{10}$ pores/mm$^2$; and
(2) a metal filling treatment carried out by electrolytic plating.
(vii) The method of manufacturing the microstructure according to (vi) above, wherein the electrode film having no voids is formed by subjecting one surface of the insulating base material to electroless plating.

As shown below, the invention provides a suitable microstructure for use in an anisotropically conductive member in which conductive paths are disposed at a dramatically increased density and filled with metal at a dramatically improved filling ratio and, even today when still higher levels of integration have been achieved, can be used as inspection connectors and the like for electronic components such as semiconductor devices. The invention also provides a method of manufacturing such a microstructure.

BRIEF DESCRIPTION OF THE DIAGRAMS

Figure 1B:
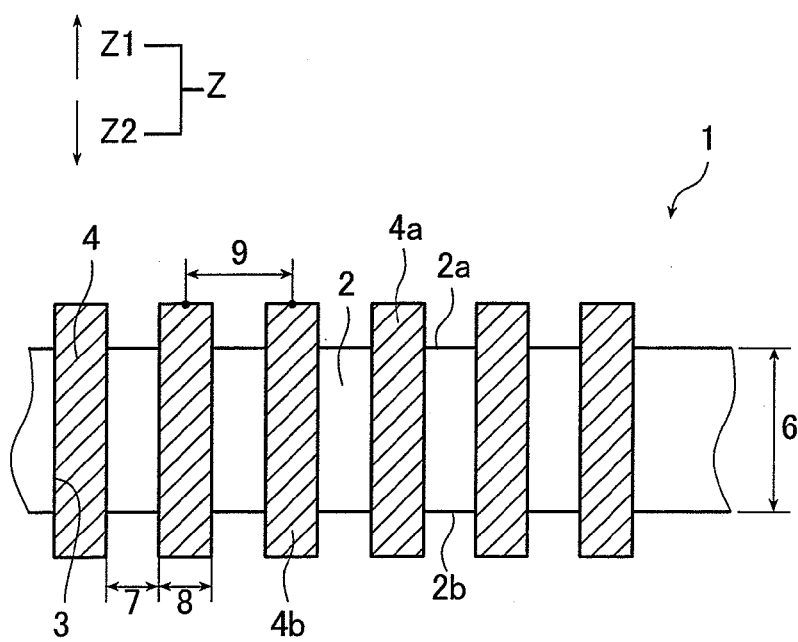
Figure 2A:
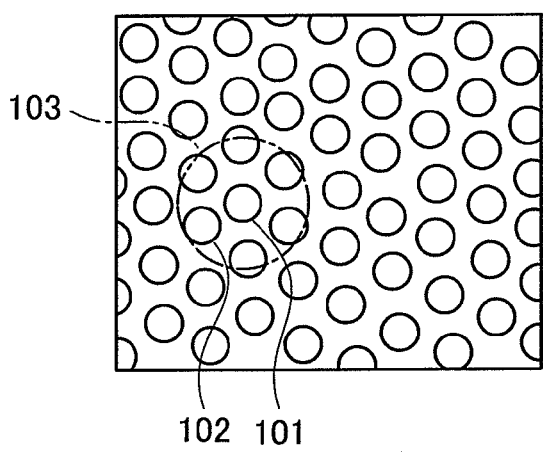
Figure 2B:
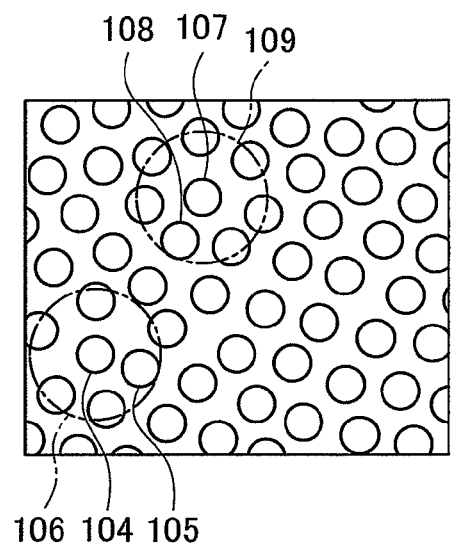

In the accompanying drawings:
FIG. 1A is a front view showing in a simplified form a preferable embodiment of a microstructure of the invention;
FIG. 1B is a cross-sectional view taken along the line IB-IB of FIG. 1A;
FIGS. 2A and 2B are diagrams illustrating a method for computing the degree of ordering of through micropores; and
FIGS. 3A to 3D are schematic end views for illustrating metal filling treatment and the like in the manufacturing method of the invention.

DETAILED DESCRIPTION OF THE INVENTION

The microstructure and its manufacturing method according to the invention are described below in detail.

The microstructure of the invention is a microstructure comprising an insulating base material having through micropores with a pore size of from 10 to 500 nm at a density of from $1\times10^6$ to $1\times10^{10}$ pores/mm$^2$, metal being filled into the through micropores at a filling ratio of at least 80%.

FIG. 1A is a front view showing in a simplified form a preferable embodiment of the microstructure of the invention and FIG. 1B is a cross-sectional view taken along the line IB-IB of FIG. 1A.

A microstructure 1 of the invention comprises an insulating base material 2 having through micropores 3, which are filled with a metal 4. In cases where the microstructure 1 of the invention is used as an anisotropically conductive member, the through micropores 3 filled with the metal 4 serve as conductive paths of the anisotropically conductive member.

In cases where the microstructure of the invention is used as the anisotropically conductive member, it is necessary for the metal 4 filled into the through micropores 3 to be exposed at both surfaces of the insulating base material 2. In other words, in cases where the microstructure 1 of the invention is used as the anisotropically conductive member, it is necessary for the metal 4 filled into the through micropores 3 to be exposed at surfaces 2a and 2b of the insulating base material 2. However, as shown in FIG. 1B, the metal 4 filled into the through micropores 3 is preferably protruded from the surfaces 2a and 2b of the insulating base material 2 to have protruding portions 4a and 4b.

Next, the materials and dimensions of the respective components of the microstructure are described.

[Insulating Base Material]

The insulating base material 2 making up the microstructure 1 of the invention has the through micropores 3 with a pore size of from 10 to 500 nm at a density of from $1\times10^6$ to $1\times10^{10}$ pores/mm$^2$. The insulating base material should have an electric resistivity of $10^{14}$ Ω·cm which is equivalent to that of an insulating base material (e.g., a thermoplastic elastomer) making up a conventionally known anisotropically conductive film.

The insulating base material is not particularly limited as long as the above-described requirements are satisfied. However, an oxide film formed by anodizing metal is preferable from the viewpoint that independent through micropores 3 with desired pore sizes are obtained and the through micropores 3 obtained have a high aspect ratio, and an alumina base material obtained by anodizing aluminum is particularly preferable in terms of its high dimensional stability and relatively low cost.

In the microstructure 1 of the invention, the through micropores 3 filled with the metal 4 are present in a state mutually isolated by the insulating base material 2, but have a density of from $1\times10^6$ to $1\times10^{10}$ pores/mm$^2$ At a density of the through micropores 3 within the foregoing range, the microstructure of the invention can be used as inspection connectors and the like for electronic components such as semiconductor devices even today when still higher levels of integration have been achieved. On the other hand, when the through micropores 3 have a density exceeding the foregoing range, it is often difficult to maintain the anisotropic conductivity due to the impedance characteristic.

The through micropores 3 preferably have a density of from $2\times10^6$ to $8\times10^9$ pores/mm$^2$ and more preferably from $5\times10^6$ to $5\times10^9$ pores/mm$^2$.

In the microstructure 1 of the invention, the through micropores 3 have a pore size (as shown in FIG. 1B by the reference symbol 8) of from 10 to 500 nm.

At a pore size of the through micropores 3 within the foregoing range, when electrical signals are passed through the micropores, sufficient responses can be obtained, thus enabling preferable use of the microstructure 1 of the invention as an inspection connector for electronic components.

The through micropores 3 preferably have a pore size of from 20 to 400 nm, more preferably from 40 to 200 nm, and even more preferably from 50 to 100 nm.

From the viewpoint that the density of the through micropores can be increased, the through micropores 3 in the insulating base material 2 making up the microstructure 1 of the invention preferably have a degree of ordering, as defined by formula (I):

$$\text{Degree of ordering (\%)} = B/A \times 100 \quad (1)$$

(wherein A represents the total number of through micropores in a measurement region, and B represents the number of specific through micropores in the measurement region for which, when a circle is drawn so as to be centered on the center of gravity of a specific through micropore and so as to be of the smallest radius that is internally tangent to the edge of another through micropore, the circle includes the centers of gravity of six through micropores other than the specific through micropore) of at least 50%.

FIGS. 2A and 2B are diagrams illustrating the method for computing the degree of ordering of the through micropores. Above formula (I) is explained more fully below in conjunction with FIGS. 2A and 2B.

In the case of a first through micropore 101 shown in FIG. 2A, when a circle 103 is drawn so as to be centered on the center of gravity of the first through micropore 101 and so as to be of the smallest radius that is internally tangent to the edge of another through micropore (inscribed in a second through micropore 102), the interior of the circle 103 includes the centers of gravity of six through micropores other than the first through micropore 101. Therefore, the first through micropore 101 is included in B.

In the case of another first through micropore 104 shown in FIG. 2B, when a circle 106 is drawn so as to be centered on the center of gravity of the first through micropore 104 and so as to be of the smallest radius that is internally tangent to the edge of another through micropore (inscribed in a second through micropore 105), the interior of the circle 106 includes the centers of gravity of five through micropores other than the first through micropore 104. Therefore, the first through micropore 104 is not included in B.

In the case of yet another first through micropore 107 shown in FIG. 2B, when a circle 109 is drawn so as to be centered on the center of gravity of the first through micropore 107 and so as to be of the smallest radius that is internally tangent to the edge of another through micropore (inscribed in a second through micropore 108), the interior of the circle 109 includes the centers of gravity of seven through micropores other than the first through micropore 107. As a result, here too, the first through micropore 107 is not included in B.

The insulating base material 2 making up the microstructure 1 of the invention preferably has a thickness (as shown in FIG. 1B by the reference symbol 6) of from 30 to 300 μm, and more preferably from 50 to 100 μm. At an insulating base material thickness within the foregoing range, the insulating base material can be handled with ease.

Moreover, in the insulating base material 2 making up the microstructure 1 of the invention, the width between the through micropores 3 (i.e., the portion represented in FIG. 1B by the reference symbol 7) is preferably at least 10 nm, more preferably from 20 to 100 nm, and even more preferably from 20 to 50 nm. At a width between the through micropores 3 filled with the metal 4 within the foregoing range, the insulating base material 2 functions fully as an insulating barrier.

In the microstructure 1 of the invention, the center-to-center distance between neighboring through micropores 3 (in FIG. 1B, the portions represented by the reference symbol 9; also referred to below as the "pitch") is preferably from 20 to 500 nm, more preferably from 40 to 200 nm, and even more preferably from 50 to 140 nm. At a pitch in the foregoing range, a balance between the diameter of the through micropores 3 and the width between the through micropores 3 (insulating barrier thickness) is easily achieved.

[Metal]

In the microstructure 1 of the invention, the metal 4 to be filled into the through micropores 3 is not particularly limited as long as the metal used has an electric resistivity of not more than $10^3$ Ω·cm. Illustrative examples of the metal that may be preferably used include gold (Au), silver (Ag), copper (Cu), aluminum (Al), magnesium (Mg), nickel (Ni), molybdenum (Mo), iron (Fe), palladium (Pd), beryllium (Be), rhenium (Re), and tungsten (W). Any one of these metals may be filled into the through micropores 3, or an alloy of two or more of these metals may instead be filled into the through micropores 3.

Of these, in terms of electric conductivity, copper, gold, aluminum and nickel are preferred, with copper and gold being more preferred.

In terms of cost, it is more preferable to use other metals than gold (e.g., copper) as the metal 4 to be filled into the through micropores 3 and to use gold only for forming the surfaces of the metal bodies exposed or protruded from both the surfaces of the insulating base material 2 (hereinafter also referred to as "end faces").

In the microstructure 1 shown in FIGS. 1A and 1B, all the through micropores 3 existing in the insulating base material 2 are filled with the metal 4 but are not necessarily required to be filled therewith provided that the ratio of the through micropores 3 filled with the metal 4 to all the through micropores 3 existing in the insulating base material 2, in other words, the filling ratio of the metal 4 is at least 80%.

The filling ratio of the metal 4 can be determined by observing the surface of the insulating base material by SEM and calculating the ratio of the number of the through micropores 3 filled with the metal 4 to the number of all the through micropores 3 within the field of view.

In cases where the microstructure 1 of the invention is used as an anisotropically conductive member, the through micropores 3 which are present in the insulating base material 2 but are not filled with the metal 4 do not function as conductive paths and therefore the anisotropically conductive member obtained is defective.

Since the microstructure of the invention has a metal filling ratio of at least 80%, when the microstructure is used as an anisotropically conductive member, this member is excellent and has extremely few defects.

The microstructure of the invention preferably has a metal filling ratio of at least 90% and more preferably at least 95%.

In the microstructure 1 of the present invention, when the metal 4 filled into the through micropores 3 protrudes from both the surfaces 2a and 2b of the insulating base material 2, the protruding portions (in FIG. 1B, the portions represented by the reference symbols 4a and 4b; also referred to below as "bumps") have a height of preferably from 1 to 1000 nm, and more preferably from 5 to 500 nm. At a bump height in this range, connectivity with the electrode pads on an electronic component improves.

The microstructure of the invention can be obtained by the inventive method of manufacturing microstructures to be described later. This method is also hereinafter referred to simply as the "inventive manufacturing method."

The invention provides a method of manufacturing a microstructure, wherein an insulating base material is subjected at least to, in order, (1) a treatment for forming an electrode film having no voids on one surface of the insulating base material having through micropores with a pore size of from 10 to 500 nm at a density of from $1\times10^6$ to $1\times10^{10}$ pores/mm$^2$ (electrode film-forming treatment); and (2) a metal filling treatment carried out by electrolytic plating.

As described above, the insulating base material having the through micropores is preferably an alumina base material obtained by anodizing aluminum.

In cases where the alumina base material obtained by anodizing aluminum is used for the insulating base material bearing the through micropores, the insulating base material can be obtained by subjecting an aluminum substrate at least to, in order, treatment (A) in which a micropore-bearing oxide film is formed by anodization (anodizing treatment);

treatment (B) in which aluminum is removed from the oxide film obtained by treatment (A) (aluminum removal treatment), and treatment (C) in which the micropores existing in the oxide film from which the aluminum has been removed by treatment (B) are made to extend through the insulating base material (perforating treatment).

Next, an aluminum substrate that may be used to manufacture an insulating base material having through micropores according to the foregoing procedure, and each treatment carried out on the aluminum substrate are described in detail.

[Aluminum Substrate]

The aluminum substrate is not subject to any particular limitation. Illustrative examples include pure aluminum plate; alloy plates composed primarily of aluminum and containing trace amounts of other elements; substrates made of low-purity aluminum (e.g., recycled material) on which high-purity aluminum has been vapor-deposited; substrates such as silicon wafers, quartz or glass whose surface has been covered with high-purity aluminum by a process such as vapor deposition or sputtering; and resin substrates on which aluminum has been laminated.

Of the aluminum substrate of the invention, the surface on which anodizing treatment to be described below is carried out has an aluminum purity of preferably at least 99.5 wt %, more preferably at least 99.9 wt % and even more preferably at least 99.99 wt %. It is preferable for the aluminum purity to fall within the above range, because the micropores have high independence, which is maintained when metal is filled into the through micropores obtained by making the micropores penetrate through the substrate, and there is no adverse effect of the leakage current and other factors when the microstructure of the invention is used as an anisotropically conductive member.

In the practice of the invention, the surface of the aluminum substrate on which the subsequently described anodizing treatment is to be carried out is preferably subjected beforehand to degreasing treatment and mirror-like finishing treatment and in particular to heat treatment in terms of improving the independence of the micropores.

<Heat Treatment>

Heat treatment is preferably carried out at a temperature of from 200 to 350° C. for a period of about 30 seconds to about 2 minutes. To be more specific, a method that involves placing the aluminum substrate in a heated oven is used, for example.

Such heat treatment enhances the independence of the micropores formed by the subsequently described anodizing treatment.

Following heat treatment, it is preferable to rapidly cool the aluminum substrate. The method of cooling is exemplified by a method involving direct immersion of the aluminum substrate in water or the like.

<Degreasing Treatment>

Degreasing treatment is carried out with a suitable substance such as an acid, alkali or organic solvent so as to dissolve and remove organic substances, including dust, grease and resins, adhering to the aluminum substrate surface, and thereby prevent defects due to organic substances from arising in each of the subsequent treatments.

Preferred degreasing methods include the following: a method in which an organic solvent such as an alcohol (e.g., methanol), ketone (e.g., methyl ethyl ketone), petroleum benzin or volatile oil is contacted with the surface of the aluminum substrate at ambient temperature (organic solvent method); a method in which a liquid containing a surfactant such as soap or a neutral detergent is contacted with the surface of the aluminum substrate at a temperature of from ambient temperature to 80° C., after which the surface is rinsed with water (surfactant method); a method in which an aqueous sulfuric acid solution having a concentration of 10 to 200 g/L is contacted with the surface of the aluminum substrate at a temperature of from ambient temperature to 70° C. for a period of 30 to 80 seconds, following which the surface is rinsed with water; a method in which an aqueous solution of sodium hydroxide having a concentration of 5 to 20 g/L is contacted with the surface of the aluminum substrate at ambient temperature for about 30 seconds while electrolysis is carried out by passing a direct current through the aluminum substrate surface as the cathode at a current density of 1 to 10 A/dm$^2$, following which the surface is contacted with an aqueous solution of nitric acid having a concentration of 100 to 500 g/L and thereby neutralized; a method in which any of various known anodizing electrolytic solutions is contacted with the surface of the aluminum substrate at ambient temperature while electrolysis is carried out by passing a direct current at a current density of 1 to 10 A/dm$^2$ through the aluminum substrate surface as the cathode or by passing an alternating current through the aluminum substrate surface as the cathode; a method in which an aqueous alkali solution having a concentration of 10 to 200 g/L is contacted with the surface of the aluminum substrate at 40 to 50° C. for 15 to 60 seconds, following which the surface is contacted with an aqueous solution of nitric acid having a concentration of 100 to 500 g/L and thereby neutralized; a method in which an emulsion prepared by mixing a surfactant, water and the like into an oil such as gas oil or kerosene is contacted with the surface of the aluminum substrate at a temperature of from ambient temperature to 50° C., following which the surface is rinsed with water (emulsion degreasing method); and a method in which a mixed solution of, for example, sodium carbonate, phosphates and surfactant is contacted with the surface of the aluminum substrate at a temperature of from ambient temperature to 50° C. for 30 to 180 seconds, following which the surface is rinsed with water (phosphate method).

Of these, the organic solvent method, surfactant method, emulsion degreasing method and phosphate method are preferred from the standpoint of removing grease from the aluminum surface while causing substantially no aluminum dissolution.

Known degreasers may be used in degreasing treatment. For example, degreasing treatment may be carried out using any of various commercially available degreasers by the prescribed method.

<Mirror-Like Finishing Treatment>

Mirror-like finishing treatment is carried out to eliminate surface asperities of the aluminum substrate such as rolling streaks formed during rolling of the aluminum substrate and improve the uniformity and reproducibility of sealing treatment by a process such as electrodeposition.

In the practice of the invention, mirror-like finishing treatment is not subject to any particular limitation, and may be carried out using any suitable method known in the art. Examples of suitable methods include mechanical polishing, chemical polishing, and electrolytic polishing.

Illustrative examples of suitable mechanical polishing methods include polishing with various commercial abrasive cloths, and methods that combine the use of various commercial abrasives (e.g., diamond, alumina) with buffing. More specifically, a method which is carried out with an abrasive while changing over time the abrasive used from one having coarser particles to one having finer particles is appropriately illustrated. In such a case, the final abrasive used is preferably one having a grit size of 1500. In this way, a glossiness of at least 50% (in the case of rolled aluminum, at least 50% in both the rolling direction and the transverse direction) can be achieved.

Examples of chemical polishing methods include various methods mentioned in the 6$^{th}$ edition of Aluminum Handbook (Japan Aluminum Association, 2001), pp. 164-165.

Preferred examples include phosphoric acid/nitric acid method, Alupol I method, Alupol V method, Alcoa R5 method, $H_3PO_4$—$CH_3COOH$—Cu method and $H_3PO_4$—$HNO_3$—$CH_3COOH$ method. Of these, the phosphoric acid/nitric acid method, the $H_3PO_4$—$CH_3COOH$—Cu method and the $H_3PO_4$—$HNO_3$—$CH_3COOH$ method are especially preferred.

With chemical polishing, a glossiness of at least 70% (in the case of rolled aluminum, at least 70% in both the rolling direction and the transverse direction) can be achieved.

Examples of electrolytic polishing methods include various methods mentioned in the 6$^{th}$ edition of Aluminum Handbook (Japan Aluminum Association, 2001), pp. 164-165; the method described in U.S. Pat. No. 2,708,655; and the method described in Jitsumu Hyomen Gijutsu (Practice of Surface Technology), Vol. 33, No. 3, pp. 32-38 (1986).

With electrolytic polishing, a glossiness of at least 70% (in the case of rolled aluminum, at least 70% in both the rolling direction and the transverse direction) can be achieved.

These methods may be suitably combined and used. In an illustrative method that may be preferably used, mechanical polishing which is carried out by changing the abrasive over time from one having coarser particles to one having finer particles is followed by electrolytic polishing.

Mirror-like finishing treatment enables a surface having, for example, a mean surface roughness $R_a$ of 0.1 μm or less and a glossiness of at least 50% to be obtained. The mean surface roughness $R_a$ is preferably 0.03 μm or less, and more preferably 0.02 μm or less. The glossiness is preferably at least 70%, and more preferably at least 80%.

The glossiness is the specular reflectance which can be determined in accordance with JIS Z8741-1997 (Method 3: 60° Specular Gloss) in a direction perpendicular to the rolling direction. Specifically, measurement is carried out using a variable-angle glossmeter (e.g., VG-1D, manufactured by Nippon Denshoku Industries Co., Ltd.) at an angle of incidence/reflection of 60° when the specular reflectance is 70% or less, and at an angle of incidence/reflection of 20° when the specular reflectance is more than 70%.

(A) Anodizing Treatment

In treatment (A), the aluminum substrate is anodized to form a micropore-bearing oxide film on the surface of the aluminum substrate.

A conventionally known method may be used for anodizing treatment. When the microstructure of the invention is used as an anisotropically conductive member, the independence of the micropores is important and therefore anodizing treatment is preferably carried out by a self-ordering method as described in, for example, JP 3,714,507 B, JP 2002-285382 A, JP 2006-124827 A, JP 2007-204802 A, JP 2007-231339 A, JP 2007-231405 A, JP 2007-231340 A or JP 2007-238988 A. This treatment is preferably carried out under the treatment conditions described in the above publications.

Other methods for forming independent micropores include ones which use imprinting (transfer methods and press patterning methods in which a plate or roll having projections thereon is pressed against the aluminum substrate to form depressions on the plate). A specific example is a method in which a plate having numerous projections on a surface thereof is pressed against the aluminum substrate surface, thereby forming depressions. For example, the method described in JP 10-121292 A may be used.

Another example is a method in which polystyrene spheres are densely arranged on the surface of the aluminum substrate, $SiO_2$ is vapor-deposited onto the spheres, then the polystyrene spheres are removed and the substrate is etched using the vapor-deposited $SiO_2$ as the mask, thereby forming depressions.

Another exemplary method is a particle beam method. In the particle beam method, depressions are formed by irradiating the surface of the aluminum substrate with a particle beam. This method has the advantage that the positions of the depressions can be freely controlled.

Examples of the particle beam include a charged particle beam, a focused ion beam (FIB), and an electron beam.

An example of the particle beam method that may be used is the method described in JP 2001-105400 A.

Still another exemplary method is a block copolymer method. This method involves forming a block copolymer layer on the surface of the aluminum substrate, forming an islands-in-the-sea structure in the block copolymer layer by thermal annealing, then removing the island components to form depressions.

An example of the block copolymer method that may be used is the method described in JP 2003-129288 A.

Yet another exemplary method is a resist patterning/exposure/etching process. In this process, a resist film is formed on the surface of the aluminum substrate by photolithography or electron-beam lithography, the resist film is then exposed and developed to form a resist pattern, and the resist is etched, forming depressions which pass entirely through the resist to the aluminum substrate surface.

In the case of using any of the above-described imprinting method, particle beam method, block copolymer method, and resist patterning/exposure/etching process, an oxide film having independent micropores can be formed on the surface of the aluminum substrate by carrying out anodizing treatment after the starting points for electrolysis have been given to the surface of the aluminum substrate by these treatments.

(B) Aluminum Removal Treatment

Treatment (B) dissolves and removes the aluminum substrate from the oxide film obtained by the above-described treatment (A).

A treatment solution which does not readily dissolve the oxide film (alumina) but readily dissolves aluminum is used for dissolution of the aluminum substrate.

That is, use is made of a treatment solution which has an aluminum dissolution rate of at least 1 μm/min, preferably at least 3 μm/min, and more preferably at least 5 μm/min, and has an oxide film (alumina) dissolution rate of 0.1 nm/min or less, preferably 0.05 nm/min or less, and more preferably 0.01 nm/min or less.

Specifically, use is made of a treatment solution which includes at least one metal compound having a lower ionization tendency than aluminum, and which has a pH of 4 or less or 8 or more, preferably 3 or less or 9 or more, and more preferably 2 or less or 10 or more.

Such treatment solutions are not particularly limited as long as they dissolve not the oxide film (alumina) but aluminum. Illustrative examples of such treatment solutions include aqueous solutions of mercury chloride, a bromine/methanol mixture, a bromine/ethanol mixture, aqua regia and a mixture of hydrochloric acid/copper chloride.

The concentration is preferably from 0.01 to 10 mol/L and more preferably from 0.05 to 5 mol/L.

The treatment temperature is preferably from −10° C. to 80° C. and more preferably from 0° C. to 60° C.

Dissolution of the aluminum substrate is carried out by bringing the aluminum substrate following the above-described treatment (A) into contact with the above-described treatment solution. Examples of contacting methods include, but are not limited to, immersion and spraying. Of these, immersion is preferred. The period of contact at this time is preferably from 10 seconds to 5 hours, and more preferably from 1 minute to 3 hours.

Following the dissolution of the aluminum substrate, the oxide film preferably has a thickness of from 1 to 1,000 μm and more preferably from 10 to 500 μm.

Following the dissolution of the aluminum substrate, the oxide film is preferably rinsed with water by the procedure to be described below prior to making the micropores extend through the oxide film. Rinsing treatment is preferably carried out at a temperature of not more than 30° C. in order to suppress changes in micropore diameter due to hydration.

(C) Perforating Treatment

Figure 3A:
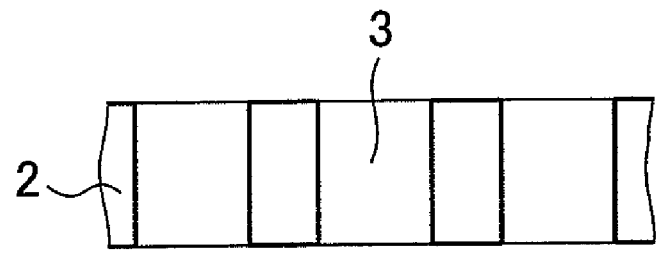

The oxide film from which the aluminum substrate has been removed in treatment (B) is subjected to treatment (C) to remove only the bottom of the oxide film to make the micropores existing in the oxide film extend therethrough. FIG. 3A shows the oxide film (the insulating base material 2) having the through micropores 3 obtained by this treatment.

This treatment is carried out by bringing only the bottom of the oxide film into contact with an aqueous acid solution or an aqueous alkali solution. Removal of the bottom of the oxide film causes the micropores to extend therethrough (to form the through micropores).

It is preferable for at least 70%, more preferably at least 85% and even more preferably at least 95% of the micropores existing in the oxide film to extend therethrough by this treatment.

The bottom of the oxide film is preferably removed by the method that involves previously immersing the oxide film in a pH buffer solution to fill the micropores with the pH buffer solution from the micropore opening side, and bringing the surface opposite from the openings (i.e., the bottom of the oxide film) into contact with an aqueous acid solution or aqueous alkali solution.

When this treatment is to be carried out with an aqueous acid solution, it is preferable to use an aqueous solution of an inorganic acid such as sulfuric acid, phosphoric acid, nitric acid or hydrochloric acid, or a mixture thereof. It is preferable for the aqueous acid solution to have a concentration of from 1 to 10 wt % and a temperature of from 25 to 40° C.

When this treatment is to be carried out with an aqueous alkali solution, it is preferable to use an aqueous solution of at least one alkali selected from the group consisting of sodium hydroxide, potassium hydroxide and lithium hydroxide. It is preferable for the aqueous alkali solution to have a concentration of from 0.1 to 5 wt % and a temperature of from 20 to 35° C.

Specific examples of preferred solutions include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide.

The oxide film is immersed in the aqueous acid solution or aqueous alkali solution for a period of preferably from 8 to 120 minutes, more preferably from 10 to 90 minutes, and even more preferably from 15 to 60 minutes.

Following perforation treatment of the micropores, the oxide film preferably has a thickness of from 1 to 1,000 μm and more preferably from 10 to 500 μm.

Following perforating treatment of the micropores, the oxide film is rinsed with water. Rinsing with water is preferably carried out at 30° C. or lower in order to suppress changes in the pore size of the through micropores due to hydration.

Any other treatment process than the above-described treatment process may be used in perforating treatment as long as the micropores formed by the treatment (A) can be made to extend through the oxide film. In the above-described treatment process, the treatment (A) forms the micropore-bearing oxide film on the aluminum substrate; the treatment (B) dissolves the aluminum substrate; and the treatment (C) partially dissolves the oxide film to remove the bottom of the oxide film thereby making the micropores extend through the oxide film. However, a treatment process in which the aluminum substrate is removed while at the same time the micropores are made to extend through the oxide film may instead be used.

To be more specific, an illustrative method that may be preferably used includes one that involves physically removing the lower portion of the oxide film formed by the treatment (A), that is, the portion of the oxide film on the aluminum substrate side through cutting with a laser or other various polishing treatments to thereby form an oxide film having through micropores.

Next, electrode film-forming treatment and metal filling treatment in the inventive manufacturing method are described in detail.

[Electrode Film-Forming Treatment]

Electrode film-forming treatment is a treatment which is carried out after the treatment (C) to form an electrode film having no voids on one surface of the oxide film bearing the through micropores.

The oxide film has on its surface openings of the through micropores but, by carrying out this treatment to form the electrode film having no voids on the surface of the oxide film, the openings are covered with the electrode film.

There is no particular limitation on the method of forming the electrode film as long as the electrode film having no voids can be formed on one surface of the oxide film bearing the through micropores. Specific examples of the forming method include electroless plating of a conductive material such as metal and direct application of a conductive material such as metal. Of these, electroless plating is preferable in terms of the uniformity of the electrode film and the ease of operation.

When electroless plating is used for electrode film-forming treatment, it is preferable to form plating nuclei on one surface of the oxide film. More specifically, a method is preferably used in which a metal or metal compound of the same type as a specific metal to be provided by electroless plating or a metal or metal compound having a higher ionization tendency than a specific metal to be provided by electroless plating is provided on one surface of the oxide film. Exemplary methods of providing such metal or metal compound include vapor deposition, sputtering and direct application, but the invention is not particularly limited to these methods.

After the plating nuclei have been provided as described above, the electrode film is formed by electroless plating. Immersion is a preferable treatment method from the viewpoint that the thickness of the electrode layer can be controlled by the time.

Use may be made of any conventionally known types of electroless plating solution. The concentration is preferably in a range of from 1 to 300 g/L and more preferably from 100 to 200 g/L.

Noble metal-containing plating solutions such as a gold plating solution, a copper plating solution and a silver plating solution are preferable in terms of increasing the conductivity of an electrode film to be formed, and a gold plating solution is more preferable in terms of the stability of the electrode with time, that is, the prevention of the deterioration due to oxidation.

The electrode film formed preferably has a thickness of from 0.05 μm to 100 μm, more preferably from 0.1 μm to 50 μm, and even more preferably from 0.2 μm to 20 μm. The electrode film may not have sufficient conductivity at a smaller thickness than the above-defined range, and more time may be required for its formation at a thickness exceeding the above-defined range.

The treatment temperature and the treatment time of electroless plating depend on the thickness of the electrode film that may be formed, but the treatment is preferably carried out at 0° C. to 90° C. for 1 minute to 10 hours, more preferably at 5° C. to 75° C. for 10 minutes to 7 hours, and even more preferably at 10° C. to 60° C. for 30 minutes to 5 hours.

[Metal Filling Treatment]

Metal filling treatment is a treatment in which, following the above-described electrode film-forming treatment, electrolytic plating using the electrode film formed is carried out to fill the interiors of the through micropores of the oxide film with metal as a conductive material, thereby giving the microstructure of the invention.

Here, the metal which is filled into the through micropores is the same material as that described above in connection with the microstructure of the invention.

In the inventive manufacturing method, electrolytic plating may be used as the metal filling method.

In the inventive manufacturing method, the electrode film having no void that was formed on one surface of the oxide film is used to carry out electrolytic plating, so metal can be filled into the through micropores existing in the oxide film at a high filling ratio.

Here, in conventionally known electrolytic plating treatments that are used for coloring or other purposes, it is difficult to selectively deposit (grow) metal inside holes having a high aspect ratio presumably because the deposited metal is consumed within the holes and the plating does not grow even when electrolysis is carried out for at least a fixed period of time.

Therefore, in the inventive manufacturing method, when metal filling is carried out by electrolytic plating, it is preferable to provide rest periods during pulse electrolysis or constant potential electrolysis. The rest periods must be at least 10 seconds, and are preferably from 30 to 60 seconds.

To promote stirring of the electrolytic solution, it is desirable to apply ultrasound energy.

Moreover, the electrolysis voltage is generally not more than 20 V, and preferably not more than 10 V, although it is preferable to first measure the deposition potential of the target metal in the electrolytic solution to be used and carry out constant potential electrolysis at that potential+not more than 1V. When carrying out constant potential electrolysis, it is desirable to use also cyclic voltammetry. To this end, use may be made of potentiostats such as those available from Solartron, BAS, Hokuto Denko and Ivium.

Plating may be carried out using a plating solution known in the art.

More specifically, when copper is to be deposited, an aqueous solution of copper sulfate may generally be used. The concentration of copper sulfate is preferably from 1 to 300 g/L, and more preferably from 100 to 200 g/L. Deposition can be promoted by adding hydrochloric acid to the electrolytic solution. In such a case, the concentration of hydrochloric acid is preferably from 10 to 20 g/L.

When gold is to be deposited, it is desirable to carry out plating by alternating current electrolysis using a sulfuric acid solution of a tetrachloroaurate.

It is preferable in electrolytic plating to preliminarily hydrophilize the inner surfaces of the through micropores so that the through micropores are more easily filled with a plating solution. In this case, an illustrative example of the method that may be preferably used includes a silicate treatment which involves providing elemental silicon to the inner surfaces of the through micropores.

The method of providing elemental silicon to the inner surfaces of the through micropores is not subject to any particular limitation, although a commonly used method of treatment involves direct immersion in an aqueous solution in which an alkali metal silicate is dissolved. The thickness of a film formed on the inner surfaces of the through micropores by hydrophilizing treatment can be adjusted by varying the ratio between the silicate ingredients silicon dioxide $SiO_2$ and alkali metal oxide $M_2O$ (generally represented as the molar ratio $[SiO_2]/[M_2O]$) and the concentrations thereof in the aqueous solution of an alkali metal silicate.

It is especially preferable here to use sodium or potassium as M.

The molar ratio $[SiO_2]/[M_2O]$ is preferably from 0.1 to 5.0, and more preferably from 0.5 to 3.0.

The $SiO_2$ content is preferably from 0.1 to 20 wt %, and more preferably from 0.5 to 10 wt %.

Figure 3B:
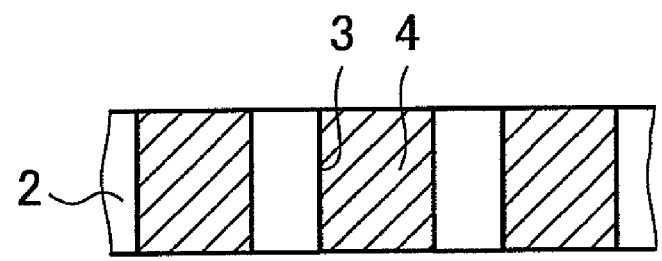

Following the above-described metal filling treatment, the electrode film is removed from the surface of the oxide film to yield the microstructure of the invention. FIG. 3B shows the state in which the metal 4 is filled into the through micropores 3 of the oxide film (insulating base material 2) by the metal filling treatment.

The inventive manufacturing method is capable of filling metal into the through micropores existing in the oxide film at a high filling ratio to yield a microstructure in which metal is filled into the through micropores at a filling ratio of at least 80%.

Surface planarization to be described below is preferably carried out to remove the electrode film from the oxide film surface.

[Surface Planarization]

In the inventive manufacturing method, the above-described metal filling treatment is preferably followed by chemical mechanical polishing (CMP) to carry out surface planarization whereby the front side and the back side of the oxide film are planarized.

By carrying out surface planarization, the electrode film formed on one surface of the oxide film is removed. The front and back sides of the oxide film after the through micropores have been filled with metal can be planarized while removing excess metal adhering to the surfaces.

CMP treatment may be carried out using a CMP slurry such as PNANERLITE-7000 (available from Fujimi Inc.), GPX HSC800 produced by Hitachi Chemical Co., Ltd., or CL-1000 produced by AGC Seimi Chemical Co., Ltd.

Mechanical polishing may be used for surface planarization. In this case, CMP may be combined with mechanical polishing or mechanical polishing may only be carried out. When surface planarization is carried out by mechanical polishing, a method is preferably used in which an object to be subjected to surface planarization is polished under load using sandpaper attached to a rotary table or an abrasive cloth having an abrasive applied thereto with the object being bonded with wax or an adhesive to a sample holder such as a highly flat metal plate or a ceramic plate.

In terms of the durability, for example, a ceramic tool (manufactured by Kemet Japan Co., Ltd.) may be employed as the sample holder for use in mechanical polishing. Exemplary materials that may be preferably used to attach an object to be subjected to surface planarization to the sample holder include waxes in terms of ease of attachment/detachment. For example, use may be made of ALCOWAX and AQUAWAX (both available from Nikka Seiko Co., Ltd.). Since the object to be polished is made of alumina, an abrasive containing diamond abrasive grains is preferably used, and for example, DP-suspension P-6 µm·3 µm·1 µm·¼ µm (available from Marumoto Struers K.K.) may be used as desired.

[Trimming]

In cases where the microstructure of the invention is used as an anisotropically conductive member, trimming is preferably carried out following the above-described metal filling treatment. However, before starting trimming, it is necessary to remove the electrode film from the oxide film having undergone the metal filling treatment. In cases where the metal filling treatment is followed by the above-described surface planarization, trimming needs to be carried out following this surface planarization.

Trimming is a treatment in which only part of the oxide film is removed from the microstructure from which the electrode film has been removed following the above-described metal filling treatment (from the microstructure whose surfaces have been planarized in cases where the above-described surface planarization was carried out) to protrude the metal filled into the through micropores from the oxide film.

Figure 3C:
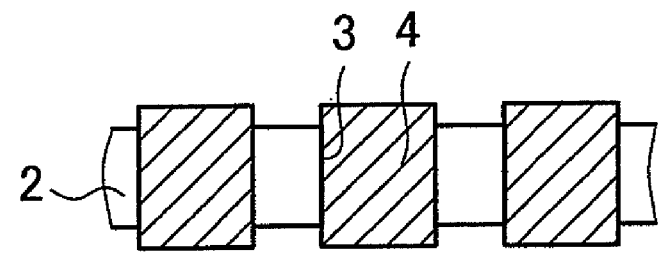
Figure 3D:
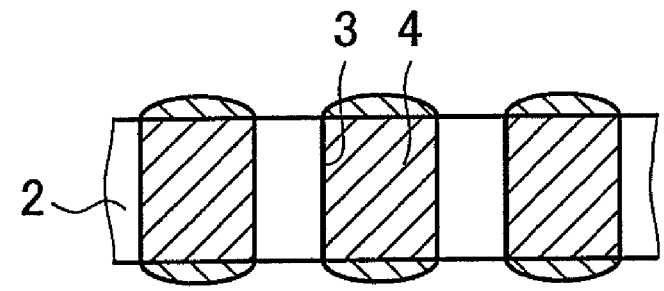

This trimming step yields a microstructure in which the metal 4 filled into the through micropores 3 protrudes from the surface of the oxide film (insulating base material) (FIG. 3C).

Trimming is carried out by bringing the oxide film into contact with an aqueous acid solution or an aqueous alkali solution under the condition that the metal filled into the through micropores are not dissolved. Examples of the contacting method include, but are not limited to, immersion and spraying. Of these, immersion is preferred.

In cases where an aqueous acid solution is used, it is preferable to use an aqueous solution of an inorganic acid such as sulfuric acid, phosphoric acid, nitric acid or hydrochloric acid, or a mixture thereof. Of these, aqueous solutions which do not contain chromic acid are preferred on account of their excellent safety. The aqueous acid solution has a concentration of preferably from 1 to 10 wt %. The aqueous acid solution has a temperature of preferably from 25 to 60° C.

On the other hand, in cases where an aqueous alkali solution is used, it is preferable to use an aqueous solution of at least one alkali selected from the group consisting of sodium hydroxide, potassium hydroxide and lithium hydroxide. The aqueous alkali solution has a concentration of preferably from 0.1 to 5 wt % and a temperature of preferably from 20 to 35° C.

More specifically, preferred use may be made of, for example, a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide. A method that uses an aqueous phosphoric acid solution with which the dissolution rate is readily controlled is particularly preferred.

The length of immersion in the aqueous acid solution or aqueous alkali solution is preferably from 8 to 120 minutes, more preferably from 10 to 90 minutes, and even more preferably from 15 to 60 minutes.

In the inventive manufacturing method, the above-described trimming may be replaced by electrodeposition in which a metal which is the same as or different from the one filled into the through micropores 3 is further deposited only on the surfaces of the metal 4.

The microstructure obtained by the procedure described above may be cut to a desired size according to its application. Exemplary methods that may be used to cut the microstructure include laser machining using, for example, a carbon dioxide gas laser, a YAG laser, a YVO laser or an excimer laser, dicing with a diamond cutter or the like, and water-jet machining. Of these, laser machining and dicing are preferable in terms of the state of the cut surface.

EXAMPLES

Examples are given below by way of illustration and should not be construed as limiting the invention.

Example 1

(A) Mirror-Like Finishing Treatment (Electrolytic Polishing)

A high-purity aluminum substrate (Sumitomo Light Metal Industries, Ltd.; purity, 99.99 wt %; thickness, 0.4 mm) was cut to a size of 10 cm square that allows it to be anodized, then subjected to electrolytic polishing using an electrolytic polishing solution of the composition indicated below at a voltage of 25 V, a solution temperature of 65° C., and a solution flow velocity of 3.0 m/min.

A carbon electrode was used as the cathode, and a GP0110-30R unit (Takasago, Ltd.) was used as the power supply. In addition, the flow velocity of the electrolytic solution was measured using the vortex flow monitor FLM22-10PCW manufactured by As One Corporation.

Electrolytic Polishing Solution Composition:

| | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

(B) Anodizing Treatment

After electrolytic polishing, the aluminum substrate was subjected to self-ordering anodizing treatment according to the procedure described in JP 2007-204802 A.

After electrolytic polishing, the aluminum substrate was subjected to 5 hours of preliminary anodizing treatment with an electrolytic solution of 0.50 mol/L oxalic acid under the following conditions: voltage, 40 V; solution temperature, 15° C.; solution flow velocity, 3.0 m/min.

After preliminary anodizing treatment, the aluminum substrate was then subjected to film removal treatment in which it was immersed for 12 hours in a mixed aqueous solution (solution temperature, 50° C.) of 0.2 mol/L chromic anhydride and 0.6 mol/L phosphoric acid.

Next, the aluminum substrate was subjected to 10 hours of re-anodizing treatment with an electrolytic solution of 0.50 mol/L oxalic acid under the following conditions: voltage, 40 V; solution temperature, 15° C.; solution flow velocity, 3.0 m/min. An oxide film having a thickness of 80 μm was thus obtained.

Preliminary anodizing treatment and re-anodizing treatment were both carried out using a stainless steel electrode as the cathode and using a GP0110-30R unit (Takasago, Ltd.) as the power supply. In addition, use was made of NeoCool BD36 (Yamato Scientific Co., Ltd.) as the cooling system, and Pairstirrer PS-100 (Tokyo Rikakikai Co., Ltd.) as the stirring and warming unit. The flow velocity of the electrolytic solution was measured using the vortex flow monitor FLM22-10PCW (As One Corporation).

(C) Aluminum Removal Treatment and Perforating Treatment

Next, the aluminum substrate was dissolved by 3 hours of immersion at 20° C. in a 20 wt % aqueous solution of mercuric chloride (corrosive sublimate), in addition to which the bottom of the oxide film was removed by 30 minutes of immersion at 30° C. in 5 wt % phosphoric acid, thereby giving an oxide film having through micropores.

(D) Heat Treatment

Next, the oxide film having the through micropores as obtained by the above treatments was then subjected to one hour of heat treatment at a temperature of 400° C.

(E) Electrode Film-Forming Treatment

Next, a treatment was carried out for forming an electrode film on one surface of the oxide film having undergone the above-described heat treatment.

To be more specific, an aqueous solution of 0.7 g/L chloroauric acid was applied to one surface, dried at 140° C. for 1 minute and further baked at 500° C. for 1 hour to form gold plating nuclei.

Then, PRECIOUSFAB ACG2000 base solution/reducer solution (available from Electroplating Engineers of Japan Ltd.) was used as the electroless plating solution to carry out immersion at 50° C. for 1 hour to thereby form an electrode film having no void.

(F) Metal Filling Treatment

Next, a copper electrode was placed in close contact with the surface of the oxide film having the electrode film formed thereon, and electrolytic plating was carried out using the copper electrode as the cathode and using platinum as the anode.

Using a mixed solution of copper sulfate/sulfuric acid/hydrochloric acid=200/50/15 (g/L) held at 25° C. as the electrolytic solution, constant-voltage pulse electrolysis was carried out, thereby producing a microstructure having the through micropores filled with copper.

An electroplating system manufactured by Yamamoto-MS Co., Ltd. and a power supply (HZ-3000) manufactured by Hokuto Denko Corp. were used to carry out constant-voltage pulse electrolysis. The deposition potential was checked by carrying out cyclic voltammetry in the plating solution, following which the film side potential was set to −2 V and electrolysis was carried out. The pulse waveform in constant-voltage pulse electrolysis was a square waveform. Specifically, electrolysis treatments lasting 60 seconds at a time were carried out a total of five times with 40-second rest periods between the respective treatments, so as to provide a total electrolysis treatment time of 300 seconds.

(G) Surface Planarizing Treatment

Next, CMP treatment was carried out on the front and back sides of the copper-filled microstructure to polish 15 μm-portions away from both the sides of the 80 μm-thick microstructure, thus removing the electrode film formed on the oxide film. The front and back sides of the oxide film were also planarized to yield a microstructure with a thickness of 50 μm.

PLANERLITE-7000 (available from Fujimi Inc.) was used as the CMP slurry.

The surface of the microstructure following CMP was observed by FE-SEM and it was found that the copper bulged out in part from the surface of the oxide film.

(H) Trimming Treatment

The CMP-treated microstructure was then immersed in a phosphoric acid solution so as to selectively dissolve the oxide film, thereby causing the columns of the copper filled into the through micropores to protrude from the oxide film to yield a microstructure in Example 1.

The same phosphoric acid solution as in the above-described perforating treatment was used, and the treatment time was set to 5 minutes.

Example 2

Example 1 was repeated except that SELF GOLD OTK (available from Okuno Chemical Industries Co., Ltd.) was used for the electroless plating solution in the above-described electrode film-forming treatment (E) thereby yielding a microstructure in Example 2.

Example 3

Example 1 was repeated except that Super Mex #850 (available from N.E. Chemcat Corporation) was used for the electroless plating solution in the above-described electrode film-forming treatment (E) thereby yielding a microstructure in Example 3.

Comparative Example 1

Example 1 was repeated except that electroless plating was replaced by sputtering in the above-described electrode film-forming treatment (E) to form a gold vapor-deposited layer to thereby obtain an electrode film on one surface of the oxide film, whereby a microstructure in Comparative Example 1 was yielded. It should be noted that the gold vapor-deposited layer (i.e., electrode layer) formed by sputtering did not cover the openings of the through micropores at the oxide film surfaces and had voids.

Comparative Example 2

Example 1 was repeated except that the above-described electrode film-forming treatment (E) was omitted, thereby yielding a microstructure in Comparative Example 2.

The microstructures in Examples 1 to 3 and Comparative Examples 1 and 2 obtained by the foregoing procedures were evaluated for the ratio at which copper was filled into the through micropores. To be more specific, the surface of each of the microstructures in Examples 1 to 3 and Comparative Examples 1 and 2 prepared by the above-described procedures was observed by SEM and the ratio of the number of through micropores filled with copper to the number of all the through micropores within the field of view was calculated. The calculation results of the filling ratio in Examples 1 to 3 and Comparative Examples 1 and 2 are shown in Table 1.

TABLE 1

| | (E) Electrode film-forming treatment | Filling ratio (%) |
|---|---|---|
| Example 1 | Electroless plating; PRECIOUSFAB ACG2000 base solution/reducer solution (available from Electroplating Engineers of Japan Ltd.) | 96 |
| Example 2 | Electroless plating; SELF GOLD OTK (available from Okuno Chemical Industries Co., Ltd.) | 92 |
| Example 3 | Electroless plating; Super Mex #850 (available from N.E. Chemcat Corporation) | 94 |
| Comparative Example 1 | Gold vapor deposition | 72 |
| Comparative Example 2 | No treatment | 25 |

What is claimed is:

1. A microstructure comprising:
   an insulating base material having through micropores with a pore size of from 10 to 500 nm at a density of from $1 \times 10^6$ to $1 \times 10^{10}$ pores/mm$^2$, a metal being filled into the through micropores at a filling ratio of at least 80%, and wherein a degree of ordering as defined by formula (I):

Degree of ordering (%)=$B/A \times 100$    (1)

(wherein A represents a total number of through micropores in a measurement region, and B represents a number of specific through micropores in the measurement region for which, when a circle is drawn so as to be centered on a center of gravity of a specific through micropore and so as to be of a smallest radius that is internally tangent to an edge of another through micropore, the circle includes centers of gravity of six through micropores other than the specific through micropore) is at least 50%.

2. The microstructure according to claim 1, wherein the insulating base material is an alumina base material obtained by anodizing aluminum.

3. The microstructure according to claim 2, wherein the metal filled into the through micropores is exposed at a surface of the base material.

4. The microstructure according to claim 2, wherein the metal filled into the through micropores protrudes from a surface of the base material.

5. The microstructure according to claim 2, wherein the metal filled into the through micropores protrudes from both surfaces of the insulating base material.

6. The microstructure according to claim 1, wherein the metal filled into the through micropores is exposed at a surface of the base material.

7. The microstructure according to claim 1, wherein the metal filled into the through micropores protrudes from a surface of the base material.

8. The microstructure according to claim 1, wherein the metal filled into the through micropores protrudes from both surfaces of the insulating base material.

9. A method of manufacturing a microstructure according to claim 1, wherein an insulating base material is subjected at least to, in order,
   (1) a treatment for forming an electrode film having no voids on one surface of the insulating base material having through micropores with a pore size of from 10 to 500 nm at a density of from $1 \times 10^6$ to $1 \times 10^{10}$, pores/mm$^2$; and
   (2) a metal filling treatment which is carried out by electrolytic plating using the electrode film.

10. The method of manufacturing the microstructure according to claim 9, wherein the electrode film having no voids is formed by subjecting one surface of the insulating base material to electroless plating.

11. The method of manufacturing the microstructure according to claim 9, wherein the insulating base material is an alumina base material obtained by anodizing aluminum.

12. The method of manufacturing the microstructure according to claim 11, wherein the electrode film having no voids is formed by subjecting one surface of the insulating base material to electroless plating.

13. The method of manufacturing the microstructure according to claim 11, wherein trimming is carried out by bringing the insulating base material into contact with an aqueous acid solution or an aqueous alkali solution under the condition that the metal filled into the through micropores not dissolved following said metal filling treatment (2).

14. The method of manufacturing the microstructure according to claim 9, wherein trimming is carried out by bringing the insulating base material into contact with an aqueous acid solution or an aqueous alkali solution under the condition that the metal filled into the through micropores not dissolved following said metal filling treatment (2).

15. The method of manufacturing the microstructure according to claim 14, said aqueous acid solution is a sulfuric acid, a phosphoric acid, a nitric acid or a hydrochloric acid, or a mixture thereof.

16. The method of manufacturing the microstructure according to claim 14, wherein said insulating base material is contacted with an aqueous acid solution or an aqueous alkali solution by immersion.

* * * * *